United States Patent [19]

Marchioro

[11] Patent Number: 5,502,683
[45] Date of Patent: Mar. 26, 1996

[54] DUAL PORTED MEMORY WITH WORD LINE ACCESS CONTROL

[75] Inventor: Alessandro Marchioro, Ferney Voltaire, France

[73] Assignee: International Business Machines Corporation, Armonk, N.Y.

[21] Appl. No.: 49,921

[22] Filed: Apr. 20, 1993

[51] Int. Cl.$^6$ ..................................................... G11C 8/00
[52] U.S. Cl. ................ 365/230.05; 365/189.04; 365/230.02; 365/230.03; 365/189.02
[58] Field of Search ................ 365/230.05, 230.03, 365/230.02, 189.03, 189.04, 149

[56] References Cited

U.S. PATENT DOCUMENTS

| | | | |
|---|---|---|---|
| 4,558,433 | 12/1985 | Bernstein | 365/230.05 |
| 4,577,292 | 3/1986 | Bernstein | 365/189 |
| 4,616,347 | 10/1986 | Bernstein | 365/230.05 |
| 4,742,487 | 5/1988 | Bernstein | 365/189 |
| 4,807,195 | 2/1989 | Busch et al. | 365/149 |
| 4,811,296 | 3/1989 | Garde | 365/230.05 |
| 4,819,209 | 4/1989 | Takemae et al. | 365/230.05 |
| 4,888,741 | 12/1989 | Malinowski | 365/230.05 |
| 5,007,028 | 4/1991 | Ohshima et al. | 365/233 |
| 5,036,491 | 7/1991 | Yamaguchi | 365/189.07 |
| 5,257,237 | 10/1993 | Aranda et al. | 365/230.05 |

FOREIGN PATENT DOCUMENTS 01073594 9/1987 Japan .

OTHER PUBLICATIONS

Geiger, Allen & Strader, "VLSI Design Technology for Analog and Digital Circuits", pp. 822 & 823, McGraw Hill (1990).
Driscoll, Matick, Puzak and Shedletsky, "Split Cache with Variable Interleave Boundary" IBM TDB vol. 22 No. 11 Apr. 1980 pp. 5183–5186.
Bernstein, K., "Port–Multiplexed Register File" IBM TDB vol. 27 No. 11 Apr. 1985 pp. 6570–6573.
Wyland, David C., "Dual–Port Rams Simplify Communication In Computer Systems" pp. 1–10, Integrated Device Technology, Inc. Apr. 1986.
Johnson, M., "Superscalar Microprocessor Design", Chapter 3, pp. 44 & 45, Prentice–Hall 1991.

*Primary Examiner*—Tan T. Nguyen
*Attorney, Agent, or Firm*—Louis J. Percello

[57] ABSTRACT

In order to access several pieces of information concurrently, computers can make use of multi-port access memories. This invention introduces a circuit for a memory system that can be used in such applications. Dual-ported memory access is achieved without duplication of the memory arrays or of the word and bit lines used in the circuit. The circuit allows concurrent read and/or write operations by controlling access to independently controlled sections of the word lines in a memory array and is useful for dual ported data caches. In instruction cache memory applications, the circuitry can be used to allow concurrent access to a number of multiple words. The total number of words accessed concurrently is equal to the total cache width and is independent of the address of the lowest word being accessed.

3 Claims, 8 Drawing Sheets

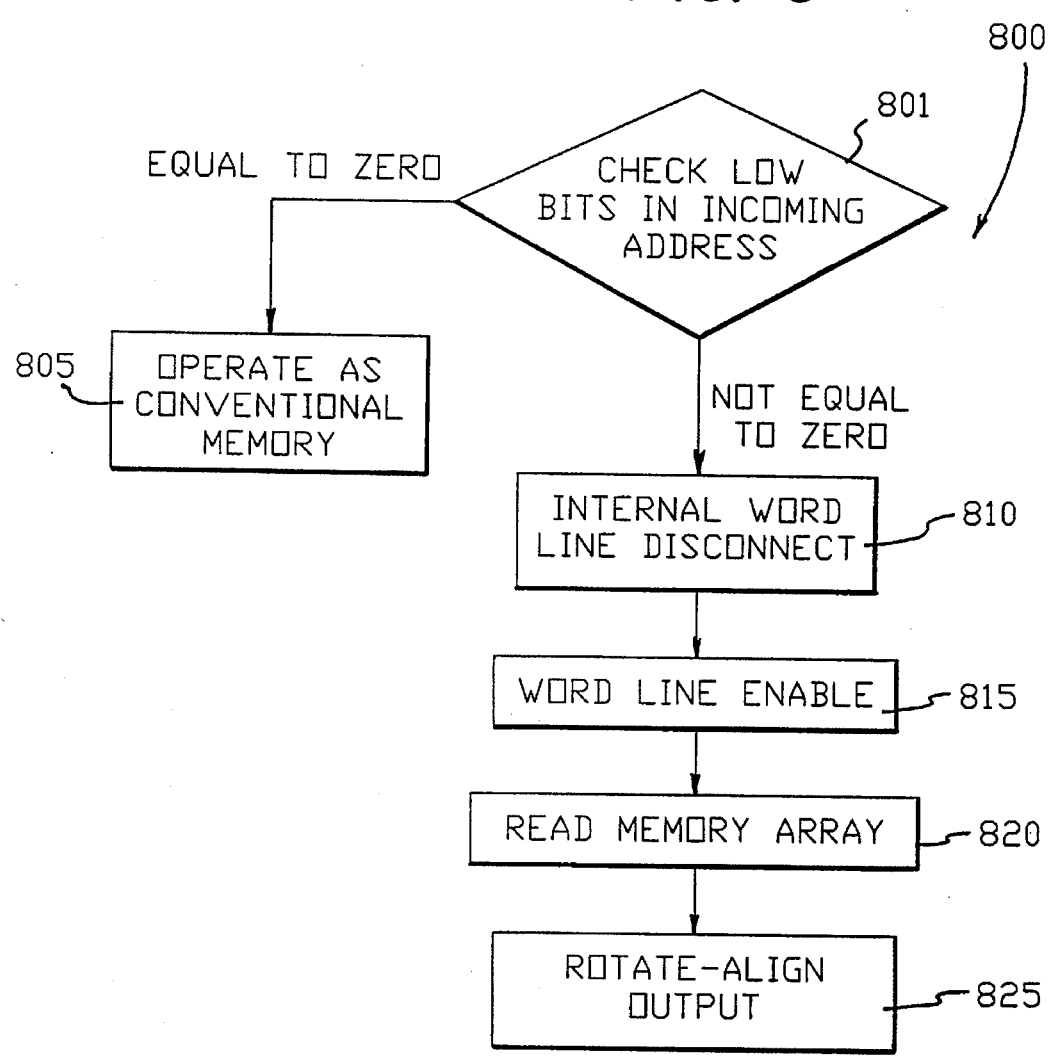

DUAL PORTED MEMORY WITH WORD LINE ACCESS CONTROL

FIELD OF THE INVENTION

This invention relates to the field of a dual ported memory apparatus used in computer systems.

BACKGROUND OF THE INVENTION

To achieve higher processing speed, some computers have several independent execution units; some of these units are capable of concurrently accessing a computer memory. These memories include cache memories for instruction and data storage that are sometimes used to achieve even faster execution speed.

Some prior art memory devices provide one single access port. However, other special memory circuits have been developed to support a plurality of access ports. These are used when multiple execution units in the computer demand several words of information at the same time. Such memories are normally known as multi-port memories.

Since some computers can execute several instructions concurrently, they need to be provided with more that one instruction word at a time. Instruction memories have been developed which are capable of providing a plurality of instruction words for each access operation. In one cycle, such memories, if properly addressed, are capable of providing a number of instructions equal to the number of words in a single memory line, i.e., where a memory line consists of a plurality of instruction words. For example, a cache memory can provide the information of all the words in a single word line when the address of the lowest word accessed corresponds to an exact multiple of the size of the cache memory line. Specifically, if a cache memory is organized in adjacent cache lines of four words (numbered from 0 to 3 within the line) and the lower two bits of the address correspond to zero, the full four words of the cache line can be read in one memory cycle operation. However, if the address of the accessed memory location modulo the size of the cache line is not zero, (i.e. assume 1 in this example), the memory reads a block of words fewer in number than the number of words in a full memory line (here four words) in one cycle. In this example, 3 words starting at position 1 in a first line are read in a first cycle. Then the remaining word(s) rounding out a full line (here 4) are read from a next word line in a subsequent cycle. In this example, one word starting at position 0 in the next line is read in the next cycle. Note that the prior art takes multiple cycles to read information from multiple cache lines if a Full cache line is demanded and the address modulo the size of the cache line is not equal to zero.

The prior art includes various ways to implement multi-port (specifically dual port) memory devices. Some dual-port memory devices use a plurality of word and bit lines to access the memory storage cells through independent electrical wires. This approach, as compared to a single port memory, normally requires a relatively larger area on silicon integrated circuits to accommodate the extra wires necessary. It also requires duplication of the sense amplifiers needed to read the memory content from the bit lines; one sense amplifier being needed for each set of bit lines. Other prior art dual port memory systems use interleaved memories. Interleaved memories have several blocks of independent single port memories. Interleaved dual-port memories can access different blocks in the same machine cycle if the addresses of the data to be read or written to are located in different blocks. If this is not the case (i.e. the two addresses are within the same block), information must be read or written from the same block and interleaved memories behave like a single port memory where two or more cycles are needed to access information. Interleaved memories do not need to use multiple sets of word and bit lines in a memory array, but they require duplication of other circuitry, such as address decoders, sense amplifiers and read/write control circuitry. Therefore, interleave memories, when implemented in integrated circuits, are typically less dense than single port memories of the same capacity.

STATEMENT OF PROBLEMS WITH THE PRIOR ART

The prior art multi-port memory circuits have several limitations. Their use of multiple sets of word and bit lines to achieve concurrent access to storage locations in the memories generally requires extra chip space, additional circuit complexity, more execution time, and more cost than single ported memory devices. The prior art multiported memory circuits are unable to access different word lines in instruction cache memories in only one memory cycle. The prior art also requires multiple cycles to read unaligned cache lines from instruction cache memories.

OBJECTS OF THE INVENTION

An object of this invention is an improved dual ported memory apparatus that requires only one set of word and bit lines.

Another object of this invention is an improved memory apparatus that can perform read-write operations on adjacent word lines in one machine cycle.

DEFINITION OF TERMS

A memory array is a matrix of N vertical columns by M horizontal rows of storage words. A total of T words (equal to N times M) is present in the array. Each word in a column comprises a plurality of storage bits (or cells). Information stored in the storage cells is accessed through 'bit lines' (typically two lines also called a 'bit line pair' is used to read information in a complementary form); the access being controlled by appropriate access devices. All storage cells in the words in a memory row, have their bit lines access devices connected to the same 'word line'. Each bit of information in a column can be connected to a 'bit-line' (pair). If a word comprises J bits, in general, J times N bit-lines (pairs) are necessary for a full cache line. (For a general reference on the organization of semiconductor memories, see R. L. Geiger, P. E. Allen, N. R. Strader: "VLSI Design Techniques for Analog and Digital Circuits", McGraw-Hill Publishing Company (1990), page 822 etc.)

In the following discussion it is assumed that the memory array is organized as follows: words in a row are organized in ascending order left to right and rows of words are organized in ascending order bottom to top. The word at the leftmost bottom corner of the array therefore corresponds to the lowest memory address and the word in the rightmost top corner of the array corresponds to the highest memory address. Other ordering arrangements are clearly possible.

A storage cell or storage bit (sometimes also referred to as a bit) is a hardware location in the memory array that stores one bit of information.

A cache line is an entire row of the memory array. A cache line consists of a plurality of words of a memory used in an array functioning as a cache memory.

An access port is a set of address lines used to determine a unique word location in the memory array, a set of data lines used to transfer data to and from the memory array, and a set of control lines used to the determine the type of operation requested on the memory (namely read or write) and the operation timing.

A row decoder (also called word line decoder) is an electronic device used to determine which memory wordline has to be accessed in a given memory operation. One binary decoder will enable at most one word line for a given memory operation. The decoder used in this disclosure can be the same as that used in conventional memory devices. The input to the word decoder is a subset of full address lines to the memory. Part of the address is used to determine the word-line or row in which the accessed information resides. The remaining bits in the address (i.e. the ones not used in the row decoder) are used by a column decoder to uniquely select the location of the information in the word line.

Driving a word line means setting an electrical signal on a word line wire such as to connect (or disconnect) tie memory storage elements in a given row to (or from) the bit lines. Typically this corresponds to connecting the word line to either a ground potential or a supply potential.

Enabling a word line means driving a word line wire with an electrical signal such that the memory storage elements of a given row are connected to the bit lines.

Disconnecting a word line means electrically opening a word line at a location between words/bits in a given row such that if an electrical signal on the word line is driven from one side of the disconnect, the signal can not propagate to the other side and vice versa. Here it is assumed that if a section of a word line is left disconnected from a word line decoder, it will remain in a state such as not to enable the storage cells connected to it.

Reading a memory word is achieved by connecting the storage cells of the memory word to the bit lines by enabling the corresponding word line and receiving the electrical signals through the bit lines on the sense amplifiers.

Writing a memory word is achieved by connecting the storage cells of the memory word to the bit lines, enabling the corresponding word line, and using an appropriate write circuitry to force the desired electrical signal into the storage cells.

SUMMARY OF THE INVENTION

This invention is an improved method and apparatus for implementing dual-port memories based on controlling the operation of word lines in memory devices. This method can be used to build both dual port data cache memories and instruction cache memories in computer systems.

The apparatus and method concerned with the data cache memory is explained first. A memory structure normally comprises an array with several rows each with an equal number of bits (memory storage cells or elements). Each row is partitioned into a given number of words that are made up of the bits in the row. The memory storage cells or elements (bits) in the words in each row can be connected to their respective bit lines by a word line for the row enabling the bit line access devices.

The present apparatus uses two row decoders, one on each side of the word lines (i.e. left and right side.) Each row decoder enables a given word line when the address in input to the decoder indicates that the particular row is to be accessed. The storage cells of the activated word line are accessed (read or written to) by bit lines connected to appropriate circuitry (i.e. sense amplifiers or write control circuitry). To prevent conflicts between row decoders driving the same word line with different electrical signals, word line access switches are placed in the rows at locations between word boundaries. The access switches are capable of disconnecting the word line into two separate sections. Control signals to activate these switches are provided by control logic. When the memory is not accessed for reading/writing, the switches are normally closed, i.e. each word line is fully connected and both decoders are not enabling any word line. When a two port operation is requested, appropriate control logic determines the control signals to these switches and either leaves the switches closed or opens them as required.

The apparatus and method used in the instruction cache memory is now described. The implementation for instruction memory requires an apparatus described above with only one row decoder and a set of control switches located between word boundaries in the word lines. The control switches open all the word lines at a selected location or boundary. The control switches can therefore divide all the word lines into two sections, one connected directly to the row decoder and one disconnected from his decoder. The control switches also join the connected section of the addressed row to the disconnected section of the next adjacent row, thus providing an alternative connection for this last section. When a full cache line is requested at an address starting on an exact cache line boundary, the memory behaves as a conventional memory array, and a full cache line can be accessed. However, when the starting address does not coincide with a multiple of the cache line size, appropriate control logic actives the appropriate control switches and enables the active side of the addressed word line (as determined by the starting or base address) along with enabling the inactive side of the next adjacent word line of the array. The two enabled parts are accessed within one machine cycle giving access to one full cache line of instructions. Data alignment circuitry orders the instructions in a proper way before the full row of instructions is placed on the port.

BRIEF DESCRIPTION OF THE DRAWINGS

FIG. 8 is a flow chart showing the method steps for the operation of the instruction cache embodiment.

DETAILED DESCRIPTION OF THE INVENTION

Figure 1:
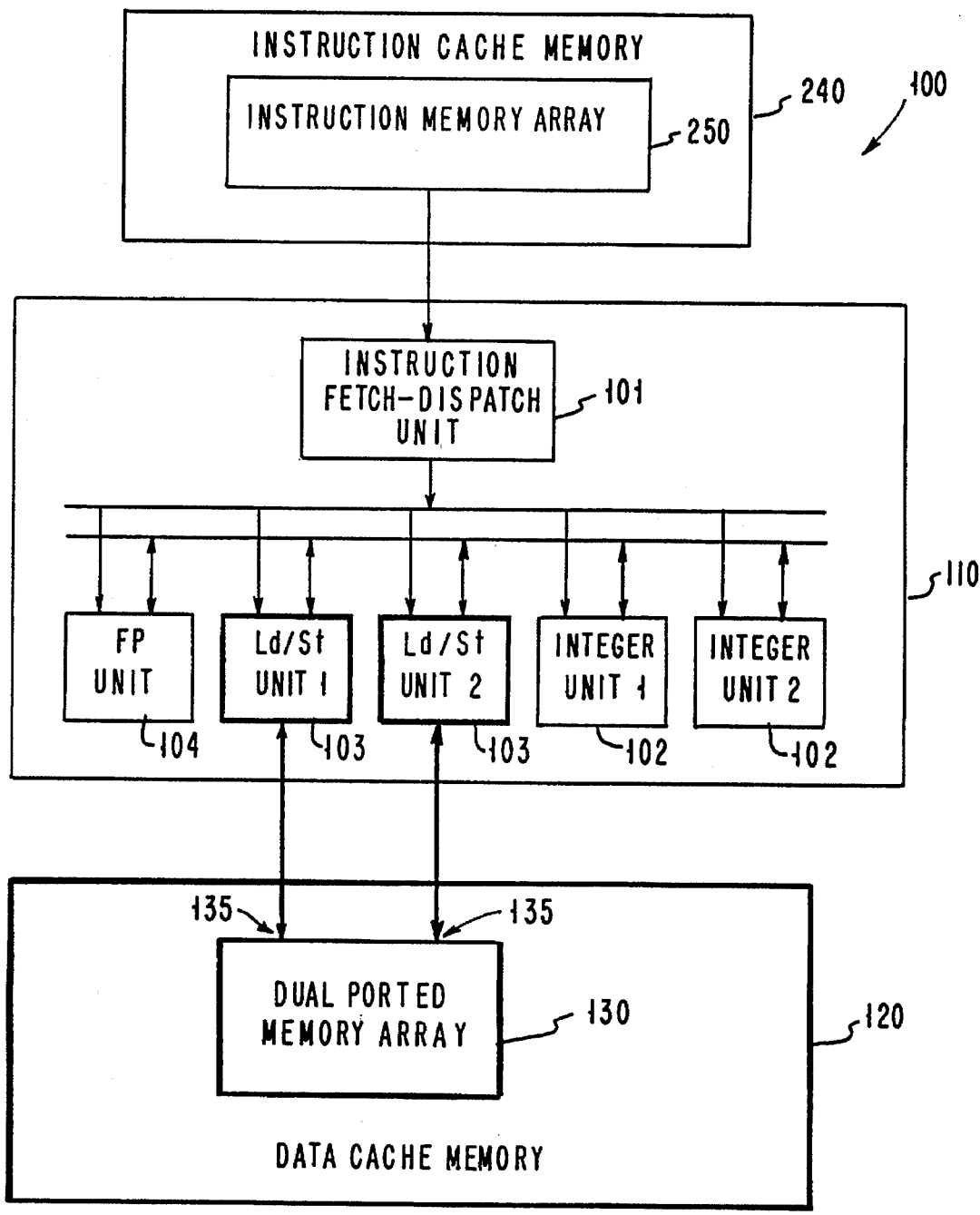
FIG. 1 is a block diagram of a general purpose superscalar computer architecture using multiple execution units, two of which are accessing two respective ports of the present memory apparatus used as a data cache memory.

FIG. 1 shows a generic computer architecture 100 (also called a 'superscalar' architecture), using multiple functional units, 101–104. The computer main processing unit 110 consists of several units (such as an instruction fetch-dispatch unit 101, two integer units 102, two load-store units 103 and one floating point unit 104) and is capable of executing several instructions concurrently. To allow the two load-store units 103 to work in parallel, the data cache 120 has a memory array 130 with two ports 135. This invention relates to the construction and operation of such a data cache memory array 130. The superscalar computer, shown in FIG. 1, is capable of reading and executing several instructions at a time during the same machine cycle. To allow concurrent and independent access to instructions and data, instruction 240 and data 120 cache memories are independent.

The detailed operation of such a generic architecture can be found in Mike Johnson "Superscalar Microprocessor Design" Prentice Hall, 1991, page 44 etc.

Figure 2:
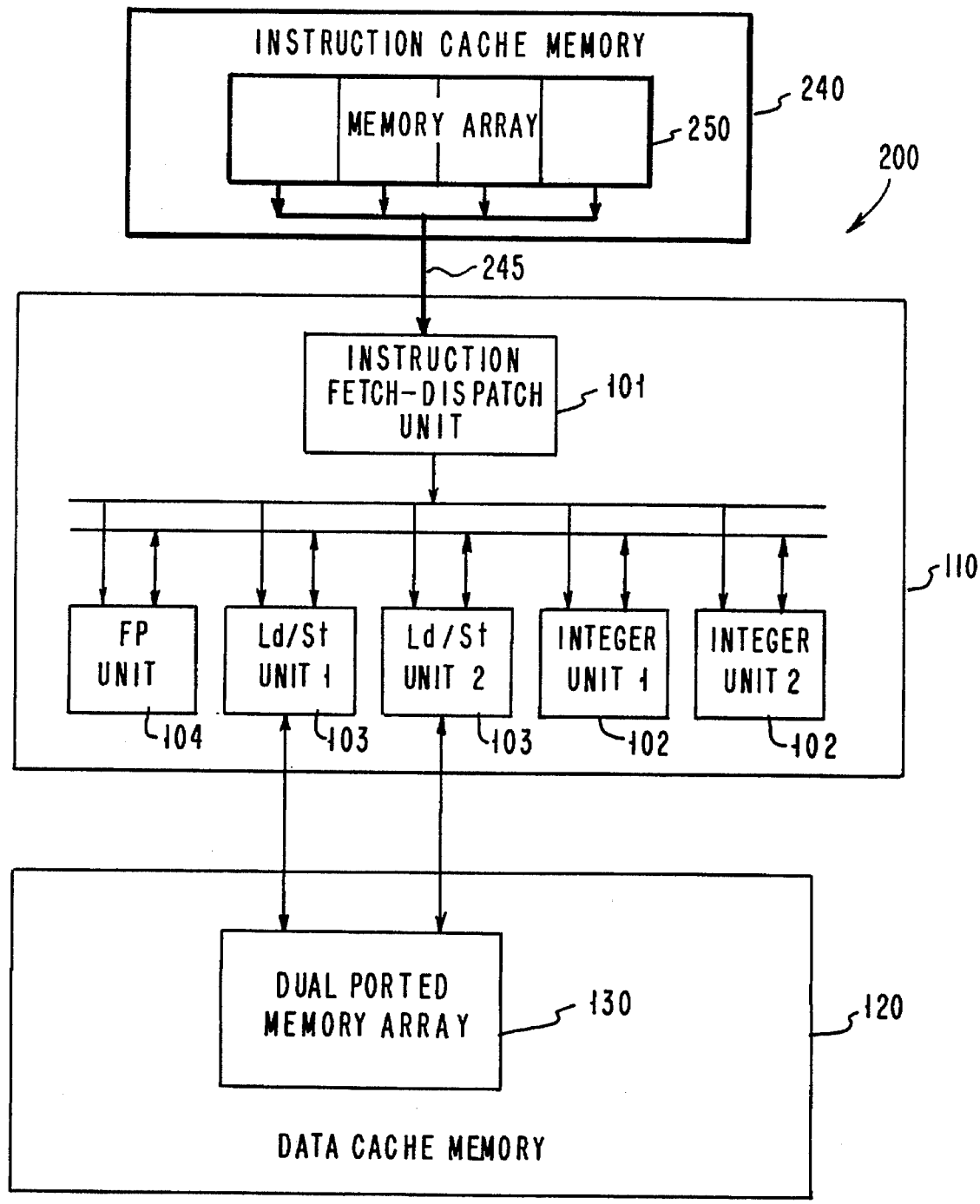
FIG. 2 is a block diagram of a superscalar computer that is accessing an embodiment of the present memory apparatus used as instruction cache memory.

FIG. 2 shows the same generic superscalar computer architecture 200, as shown in FIG. 1. Here the instruction unit 101, integer units 102, load/store units 103, and floating point unit 104 perform the same functions as described above. The present invention is used as a dual ported memory array 130 in the data cache memory 120. However, the present invention is also used in the instruction cache memory array 240 to provide the instruction unit 101 access to a full instruction cache line independent of the instruction memory array 250 starting address (base address) of the instruction fetch request. The instruction fetch-dispatch unit 101 reads multiple instructions concurrently from the instruction cache 240 over the path 245 and dispatches them to the appropriate execution units, 102–104. The objective of the instruction cache 240 is always to provide the maximum number of instructions to the mail processing unit 110 that the main processing unit 110 is capable of processing. This maximum number of instructions that can be read is equal to the number of words in a line in the instruction cache memory.

Figure 3:
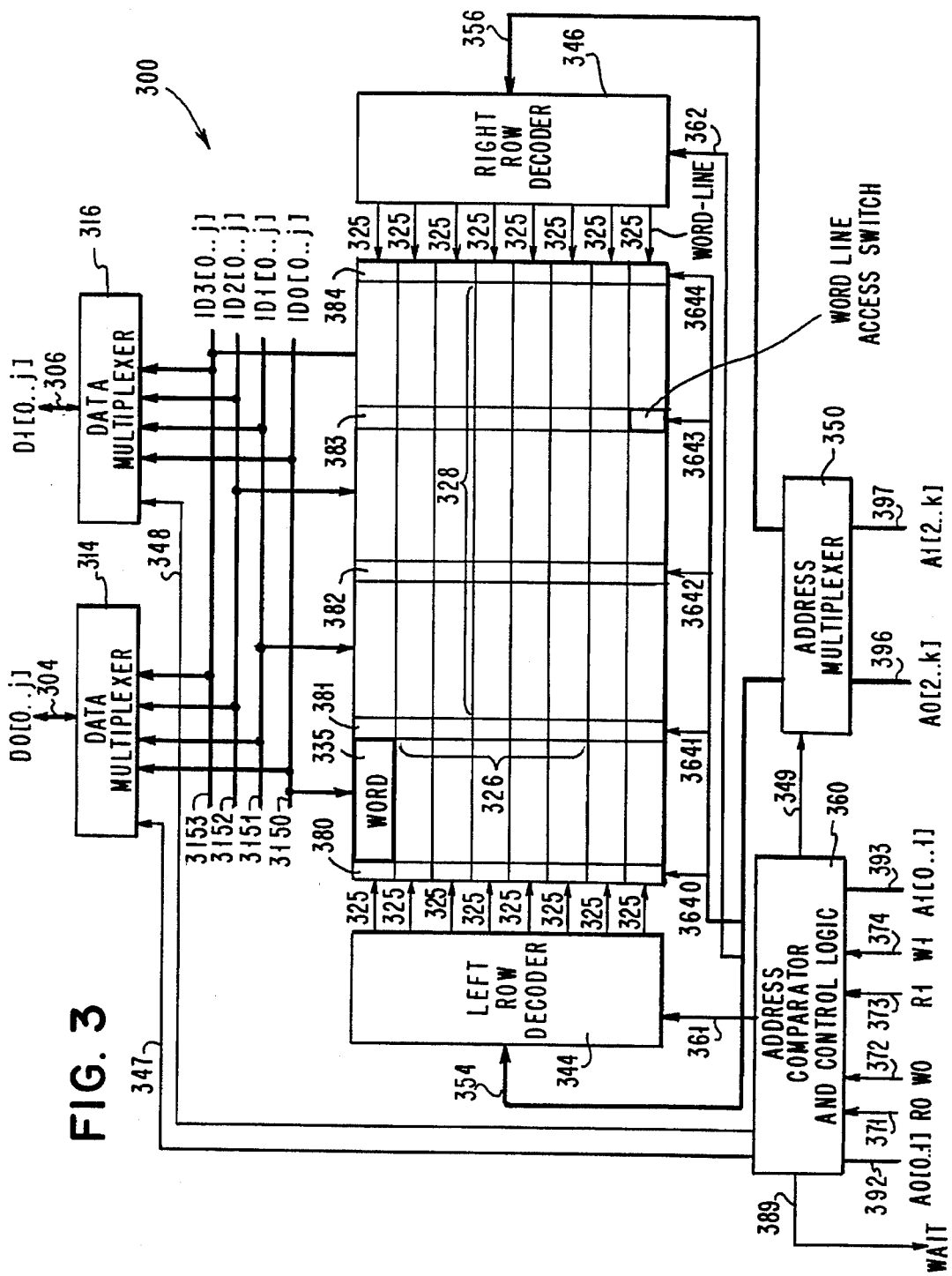
FIG. 3 is a block diagram showing a preferred structure of the present dual ported memory apparatus.

FIG. 3 shows the structure of the dual ported memory 300 using the word line access control method introduced by this invention. The dual ported memory 300 is one preferred embodiment that can be used in FIG. 1 block 120. The dual ported memory 300 comprises a memory array 320, a left row decoder 344, a right row decoder 346 that drive word lines (typically 325) of the memory array 320, two data multiplexers (314 and 316), an address comparator and control logic block 360, and an address multiplexer 350.

In this preferred embodiment, the type of operation to be performed on the array 320 is determined by control lines 371, 372, 373 and 374. Control line 371 is a read request for access port 0. Control line 372 is a write request for access port 0. Control line 373 is a read request for access port 1. Control line 374 is a write request for access port 1.

The preferred memory array 320 has rows (typically 326) of storage cells organized into groups called words (one word being 335) of a given length of bits. The memory array 320 also has columns (typically 328) that are defined by boundaries (typically 380, 381,382, 383 and 384.) In this example embodiment, the boundaries divide each row into four words.

In the memory array 320 it is assumed that the words in the columns are organized such as to have the word corresponding to the lowest address in the row on the left and the word corresponding to the highest address in the row to the right, i.e. words in a row are organized in ascending order from left to right. Of course, the words in a row can be arranged in descending order.

The boundaries generally define the beginning and end of the words 335 in the rows 326 of the memory array 320, the boundaries 380, 381,382, 383 and 384 thus define columns 328 of a given number of row bits, generally one word 335 in width. A word line access switch (typically 330) is placed on each row 326 at each boundary 380, 381,382, 383 and 384 of the row 326. Each word line access switch 330 is controlled (opened and closed) by the address comparator and control logic block 360 by one line of the set of control lines 364 (such as 3640, 3641, 3642, 3643 and 3644). The word line access switches in a column (such as 381) are all controlled by the same vertical control line (such as 3641.) When a word line access switch 330 is opened, it electrically isolates the word lines 325 of the rows 326 on which the switch, is located into two sections, a right section and a left section. When the memory is not accessed, all word line access switches are closed, i.e. all word lines are fully connected from the left decoder to the right decoder.

The decoders 344 and 346 used in this memory are conventional binary decoders as used in conventional memories. Only one word line of type 325 for each of the decoders 344 and 346 is enabled at any given memory cycle.

The internal bidirectional data lines 3150, 3151, 3152 and 3153 connect the output of the bit lines to the data multiplexer and read-write amplification boxes 314 and 316. Specifically internal data lines 3150 connect the bit lines in the leftmost column of words to the two boxes 514 and 316; internal data lines 3151 connect similarly the second column to the same boxes 314 and 316; internal data lines 3152 connect the third column to the data multiplexers 314 and 316; and internal data lines 3153 connect the rightmost column of words to the data multiplexers 314 and 316.

The multiplexers and read-write amplification boxes 314 and 316 also contain conventional multiplexers. In a read operation, data multiplexer 314 receives input from one of the possible four sources 3150, 3151, 3152 and 3153 (ID0[0 . . . j], ID1[0 . . . j], ID2[0 . . . j] and ID3[0 . . . j]) and selects one output to the data output bus 304. In a write operation, the input lines 304 are directed to one of the appropriate internal lines 3150-3153. The data multiplexer 316 works likewise.

The incoming two sets of address lines are assumed to be (k+1) bits wide. These two input addresses, A0[0 . . . k] (such as 392 and 396) and A1[0 . . . k] (such as 393 and 397) are split into two parts-the first part called a column address and a second part called the word address. In a preferred embodiment, the first part comprises the lower bits of each input address and the second part comprises the remaining bits in the address. Words located in the memory array can be accessed (read-written) by using the row address bits (396 and 397) to select the word line where the accessed information resides and the column address (392 and 393) to determine where in the selected row the information is located. The number of low-bits required for the column address is equal to the logarithm base 2 of the size of the row, (i.e. for a row size of 4 words, 2 bits are required; for a row size of 8 words, 3 bits are required etc.).

The columns address (the low bits) of the first address (in this example A0[0 . . . 1]) are directed to lines 392 and the row address (the high bits A0[2 . . . k]) to lines 396; the column address (the low bits) of the second address (in this example A1[0 . . . 1]) are directed to lines 393 and the word address (the high bits A1[2 . . . k]) to lines 397. Since the number of low bits used is equal to the logarithm base 2 of the size of the cache line (the example in FIG. 3 is four words wide), two low bits are used.

The address multiplexer 350 is controlled by the line 349 generated in the control block 360 and it operates as follows when the control line 349 is at the ground potential it connects the input address lines 396 (the row address of the first address) to the output lines 354 and the input lines 397 (the row address of the second address) to the output lines 356 respectively. When the input control line is at a supply potential, it connects the input address lines 396 to the output lines 356 and the input address lines 397 to the output lines 354 respectively.

Control lines 361 and 362 are driven by the box 360. These lines indicate to the boxes 344 and 346 if any word line 325 has to be enabled in a given cycle based on the request pending on the lines 371, 372, 373 and 374.

The address comparator and control logic block 360 receives in input the two sets of low bits of input addresses 392 and 393 (A0[0 . . . 1] and A1[0 . . . 1]). The low bits of these addresses are used in block 360 to determine one of three possible conditions:

i) the low bits in 392 and 393 are equal: in this case the memory can not work as a dual ported device, and port 393 (or alternatively port 392) is signaled to wait through the 'wait' signal 389. Only the left decoder 344 is enabled through line 361.

ii) the value of the low bits 392 is smaller than the one on 393: then the high part of the first address 396 (A0[2 . . . k]) is directed by the address multiplexer 350 to the output lines 354 to the decoder 344 and the high part of the second address 397 (A1[2 . . . k]) is directed also by the address multiplexer 350 to the output lines 356 to the decoder 346. The control line 349 is set to a ground potential. Both decoders 344 and 346 are enabled through control lines 361 and 362 respectively.

iii) the value of the low bits 392 is higher than the one on 393k: then the high part of the first address 396 (A0[2 . . . k]) is directed by the address multiplexer 350 to the output lines 356 to the decoder 346. The high part of the address 397 is directed also by the address multiplexer 350 to the output lines 354 to the decoder 344. The control line 349 is set to a supply potential. Both decoders 344 and 346 are also enabled through control lines 361 and 362 respectively.

At the same time, the address comparator and control logic 360 will perform the following operation on the switches 330 of columns 380, 381, 382, 383 and 384 in the three cases explained below:

i) the low bits in 392 and 393 are equal only the left decoder 344 will be activated and the right decoder 346 ;11 not enable any of its output lines 325. The rightmost column of switches 330 at boundary 384 is opened, thus disconnecting the right row decoder 346 from the word lines 325 in the array 320. (In alternative embodiments, the roles of the decoders 344 and 346 could be reversed.)

ii) the value of the low bits 392 is smaller than the one on 393, then the control logic in block 360 will open the switches 330 at the boundary at the right of the word being addressed by the two low bits 392 (for example, if the address lines A0[0 . . . 1] indicate a value of 1, the switches at boundary 382 will be opened). The control logic block 360 will also open the switches 330 at the boundary at the left of the word being addressed by the two low bits 393 (for example, if the address lines A1[0 . . . 1] indicate a value of 3, the switches at boundary 383 will be opened).

iii) the value of the low bits 392 is higher than the one on 393, then the control logic in block 360 will open the switches 330 at the boundary at the left of the word being addressed by the two low bits 392 (for example, if the address lines A0[0 . . . 1] indicate a value of 2, the switches at boundary 382 will be opened). The control logic block 360 will also open the switches 330 at the boundary at the right of the word being addressed by the two low bits 393 (for example, if the address lines A1[0 . . . 1] indicate a value of 0, the switches at boundary 381 will be opened).

The operation of the data multiplexers 314 and 316 is determined by the control lines 347 and 348 as follows: in a memory access operation the control logic block 360 will signal through lines 347 to the multiplexer 314 to connect the data lines 304 to one set of the the internal data lines 3150, 3151, 3152 and 3153 as specified by the two low bits 392 of the first address (A0[0 . . . 1]). The control logic block 360 will also signal through lines 348 the multiplexer 316 to connect the data lines 306 to one set of the the internal data lines as specified by the two low bits 393 of the second address (A1[0 . . . 1]). As an example, if the address lines 392 are equal to the value 2 and the address lines 393 are equal to the value 3, the multiplexer 314 will connect the data lines 304 to the internal lines 3152 and the multiplexer 316 will connect the internal data lines 3153 to the data lines 306.

Figure 4:
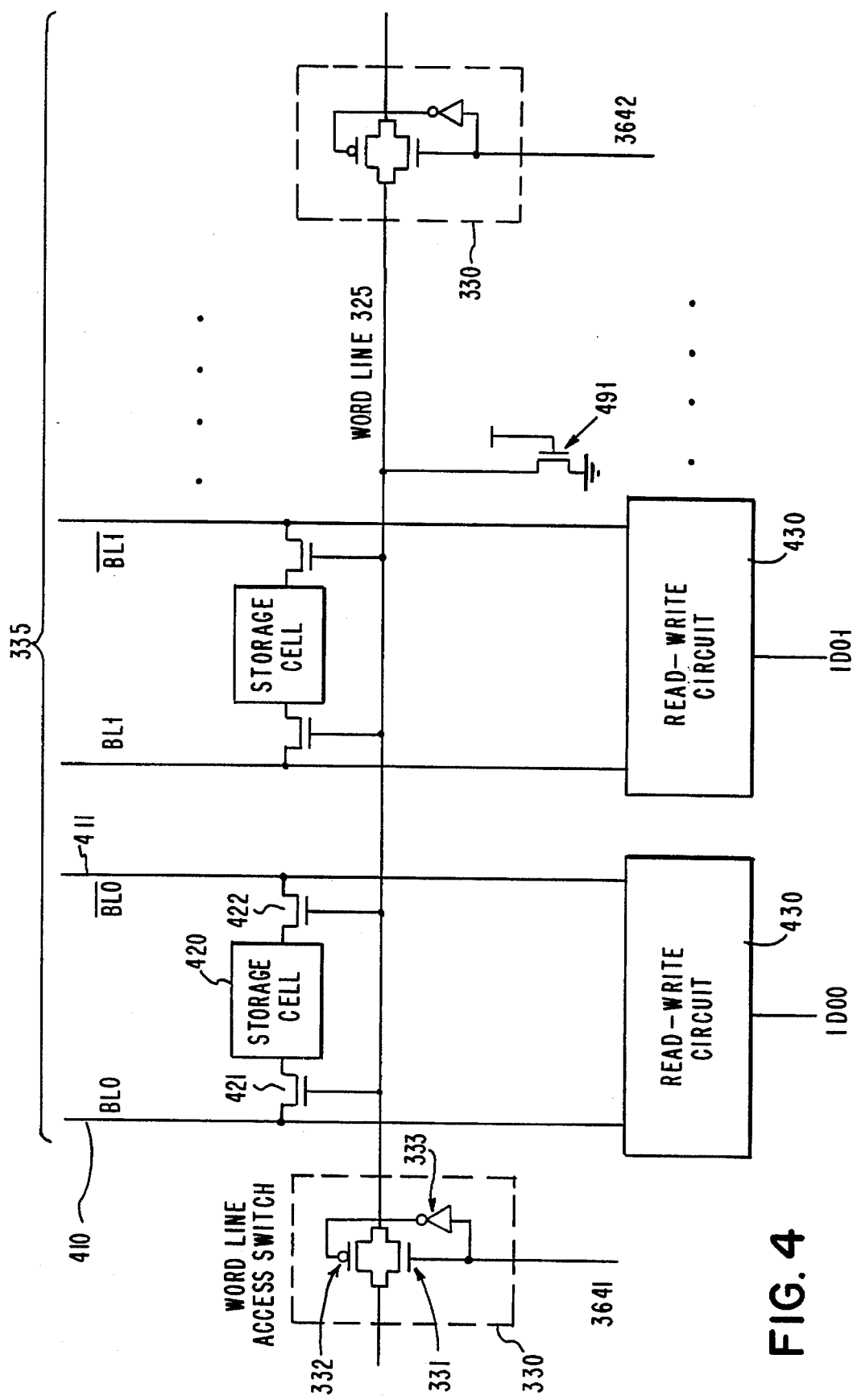
FIG. 4 is a block diagram showing details of one embodiment of a word line of the present invention including a word line access switch.

FIG. 4 shows the details of a section of a word element 335 and the operation of the word line access switch 330. For simplicity, only two storage cells (bits) 420 are shown. One preferred implementation of the word line access switch 330 is shown. Other implementation, depending on the silicon technology used are possible and are contemplated by this disclosure.

Memory storage cells/elements (typically 420) are connected through transistor NMOS devices (typically 421 and 422) to the bit lines 410 and 411. This is done as in conventional single port memories. Read-write control circuit blocks 430 are provided for reading information from the storage cells 420 and writing information into them. The word line 325 enables the devices 421 and 422 to connect the cell 420 to the complementary bit lines 410 and 411.

The operation of the word line access switch 330 is the same as that of a conventional transmission gate in CMOS logic and can be explained as follows: when the control line (typically 364) is active (i.e. connected to the supply voltage potential) the NMOS device 331 has a supply potential on its gate and will conduct, the PMOS device 332, through the inverter 333 has a ground potential on its gate and will also be conducting. Both devices 331 and 332 will therefore conduct, and an electrical signal on the word line 325 can propagate along the word line 325 across the access switch 330, i.e., the access switch 330 is closed.

When the control line 3641 is inactive (i.e. connected to ground potential), the NMOS device 331 is not conductive and the PMOS device 332 is also not conducting, thus isolating the word line 325 into two sections, at the right and at the left of the switch element 330. Here the control switch 330 is open.

The NMOS device 491 is a small size NMOS transistor with the gate connected permanently to a supply voltage potential, the drain to the word line 325 and the source to the ground potential. One such transistor is present in each word line 325 per each word 335 (or alternatively between each grouping of bits between a boundary). This transistor provides a weak connection to the ground potential for a section of a word line 325 in a word 335 when access switches 330 on either side of the word are opened. In this way, no section of word line 335 can be left floating, i.e. without a connection to either a ground potential or a supply voltage potential. When both switches 330 at the left and at the right of the word 335 are opened, the transistor 491 provides a connection of the section of word line between them to ground potential. The dimension of the transistor 491 is small such that when one (or both) of the two access switches 330 is closed, the signal propagated along the word line 325 is not affected by the presence of NMOS transistor 491.

Figure 5:
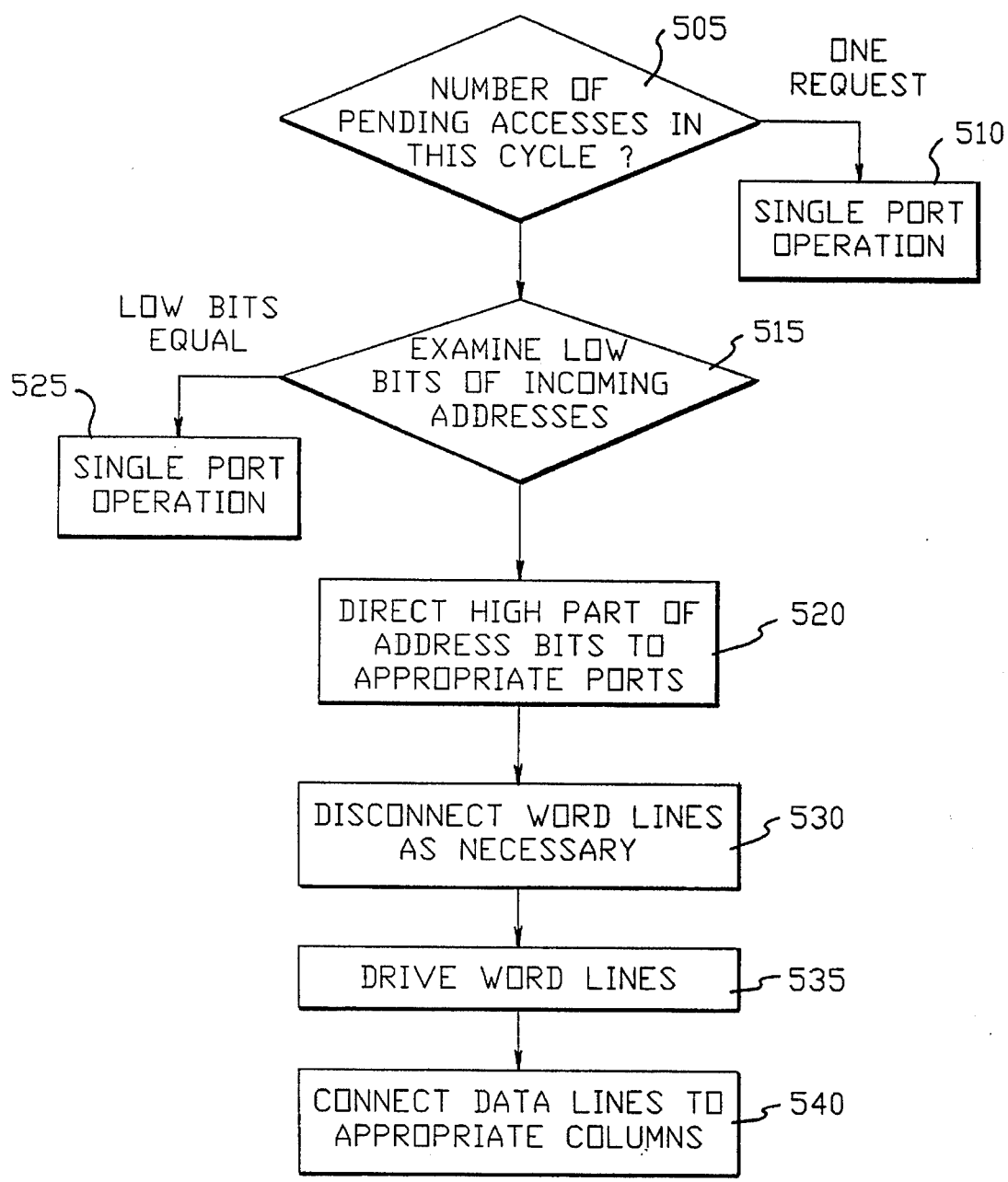
FIG. 5 is a flow chart showing the steps of reading information from or writing information to the present invention used as data cache memory.

FIG. 5 shows a flowchart summarizing the method used in the invention for the dual-port data cache memory. In this explanation is assumed that a cache lines consists of N words, thus giving n=log2(N) bits in the low part of the address. FIG. 3 has N equal to 4 and n equal to 2. It is also assumed that the memory array has a total of T words.

In decision block 505, the number of accesses (read or write) requested from the data cache memory in the current cycle is determined by examining lines 371, 372, 373 and 374 (R0, W0, R1 and W1 shown in FIG. 3). If only one request is pending at one of the two ports of the memory, the next step will be performed as described in box 510. If two requests are pending, the next step will be performed as described in box 515.

In box 510, the memory operates as a conventional single-port memory. Refer to FIG. 3. If the request is pending on port 0 (i.e. address lines 392 and one of the control lines 371 or 372 are active), the switches 330 located at boundary 384 are opened and the memory works as a conventional single port memory with the left decoder 344 driving the word lines 325. Then the data multiplexer 314 is used to transfer data to the data lines 304. If instead the request is pending on port 1 (i.e. address lines 393 and one of the control lines 373 or 374 are active), the switches 330 located at boundary 380 are opened and the memory works as a conventional single port memory with the right decoder 346 driving the word lines 325; the data multiplexer 316 is used to transfer data to or from the data lines 306.

In box 515, the 'n' low bits of the addresses at the two ports (392 and 393) are examined in the hardware box 360. Refer to FIG. 3. If these bits are identical, only one access is possible in the current memory cycle and the next step will be performed as described in box 525: one port is enabled to operate on the memory and the other is held until the next available memory cycle by activating the 'wait' line 389 in FIG. 3. If the low bits are different, these are used to determine which address is directed to the left-side decoder and which is directed to the right-side decoder of the memory array. Refer to FIGS. 3 and 4. When the low address bits are different, the next step will be performed as described in box 520.

In block 520 the row address part of the two incoming addresses are physically directed using the address multiplexers 350 to the left decoder and the right decoder. The incoming address with the lower 'n' bits is directed to the left decoder of the array and the one with the higher two bits is directed to the right decoder. At the same time, the same 'n' low bits are used to select the sources for the data multiplexers, i.e. to direct the data from/to the memory to the correct data port 304 or 306.

In block 525, the memory operates as a conventional single-port memory. This block is identical to block 510 where it is assumed that only one port, here port 0, is operational. Alternatively, only port 1 could be operational.

In block 530, the 'n' low bits are used to disconnect the word lines at selected locations as follows: the left decoder drives the word line up to and including the word that has to be accessed from the left side. The right decoder drives the word line up to and including the word that has to be accessed from the right side. For example, if the low 'n' bits to the left decoder receive the value 1, the word lines at the left side are disconnected at the right boundary of word 1. If the two low bits to the right decoder have the value 3, the word lines at the right side are disconnected at the left boundary of word 3.

In box 535 the word lines are enabled from the decoders and the words addressed in the array are read or written by connecting the addressed word bit lines (typically 410 and 411) to the storage cells of the addressed words (typically 420) through the access devices (typically, 421 and 422.)

In box 540 the multiplexers 314 and 316 direct the words from the data ports to/from the correct word column. This is done by examining the low 'n' bits of the addresses A0 and A1. The data multiplexer 314 connects the data lines 304 to one of the internal data lines 3150, 3151, 3152 or 3153 as specified by the column address bits 347. The data multiplexer 316 works likewise using information from the column address 348.

Figure 6:
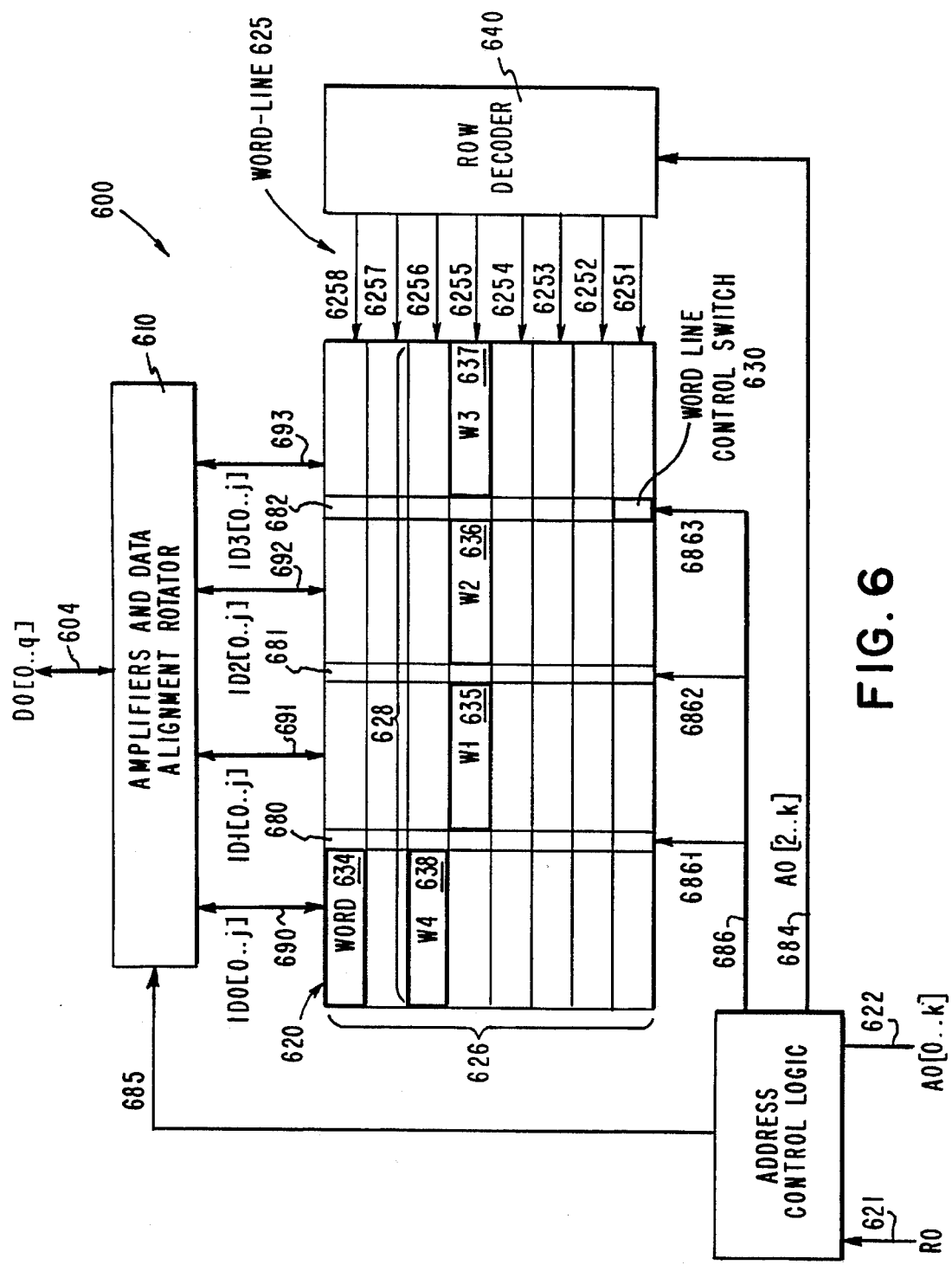
FIG. 6 is a block diagram showing the present invention used in a computer instruction cache memory.

FIG. 6 shows the structure of the instruction cache memory 600 (as in the block 240 in FIG. 2) introduced by this invention. In FIG. 6 it is assumed that the instruction cache memory port comprises: (k+1) address lines A0[0 . . . k] 622, (q+1) data lines D0[0 . . . q] 604, and a read control line R0 621. It is assumed that each array row consists of four words, typically 634. The width of the data line bus 604 is equal to four times the width of a word 634 in the memory array 620, i.e., it is equal to the total number of bits in a row.

The figure uses a new type of word line switch called a control switch 630 which is explained below and shown in FIG. 7.

The function of the amplifiers and data alignment and rotator box 610 is as follows: the bit line sense amplifiers are contained in this box. Bit line sense amplifiers can be as in conventional memories. The data rotator takes in input the four sets of data lines 690, 691, 692 and 693 and, depending on the value of the low 'n' address bits and realigns them in a way such that the data at the lowest input address always appears left aligned in the output lines 604. The other data (words) are arranged in increasing sequential order. Incidentally, in this embodiment, the next line in the memory that is used to provide the addition information to make up a full cache line of instructions is the next line to be executed. The ordering of the line is determined by the binary decoder 640.

The decoder 640 is a conventional binary decoder as used in conventional memories. The word lines (generally 625) output (6251 to 6258) are assumed to be decoded in ascending order, i.e. word line 6251 corresponds to the lowest input address on lines 684 and line 6258 corresponds to the highest input address on lines 684.

The memory array 620 has rows (typically 626) of storage cells organized into groups called words (such as 634) of a given length of bits. The memory array 620 also has columns of words that are defined by boundaries (typically 680, 681 and 682)

The boundaries generally define the beginning and end of the words 634 in the rows 626 of the memory array 620. The boundaries 680, 681 and 682 thus define columns 628 of words. A word line control switch 630 is placed on each row 626 at each boundary 680, 681 and 682. Each word line control switch 630 is controlled (opened and closed) by the address control logic block 660 by one line of the set 686 such as 6861, 6862 and 6863. The word line control switch 630 is explained in FIG. 7. The control switches 630 are normally closed, that is the word lines 625 are fully connected across a row 626.

When a word line control switch 630 is activated, it electrically disconnects the word line 625 of the row 626 on which the switch is located into two sections, a right section and a left section. Simultaneously, all control switches at the same boundary electrically disconnect their respective word lines 625 in a similar manner. In FIG. 6, the right sections of each word line 625 remain connected to the decoder 640. Each control switch further connects the right section of its respective word line to the left section of the next adjacent word line.

The address lines are input to the address and control logic block 660. In this block, the input address lines are split into two parts in a similar fashion to that described above. The first part, the column address, comprises 'n' bits. These bits are the lowest bits of the address and 'n' is equal to the logarithm base 2 of the width of the cache lines in words. (In this example, as the cache line consists of four words, 'n' is equal to 2.) The second part, the word line address (row address), comprises the remaining (k+1–n) bits. In the preferred embodiment, the row address comprise the high (k+1–n) bits. These bits are passed directly to the decoder 640 via the lines 684.

The low 'n' bits (information position selector) are used as follows:

i) if the low 'n' bits are all equal to zero, none of the word line control lines 686 (such as 6861, 6862 and 6863 are activated) and all the word line control switches (such as 630) are left closed. In this way, all word lines 625 are completely connected across the full cache lines. Furthermore, no connection exists across different word lines.

ii) if the low 'n' bits are different from zero (assume it has the value 'r', where in this example 'r' is larger than zero and smaller or equal to three), then the word line control switches 630 in the column to the left boundary of the word 'r' are activated. When a column of switches 630 is activated, each word line section at the right of the switch is connected to the next adjacent word line section at the left of the switch. In the example in FIG. 6, if the low bits are equal to 1 ('r' equal to 1), then a word line such as 6255 is disconnected at the left of word W1 (box 635) and the section of word line of word W4 (box 638) is also connected to line 6255. In this way, if word line 6255 is enabled by the row decoder, the words W1, W2, W3 and W4 can be read all in one single memory cycle.

Figure 7:
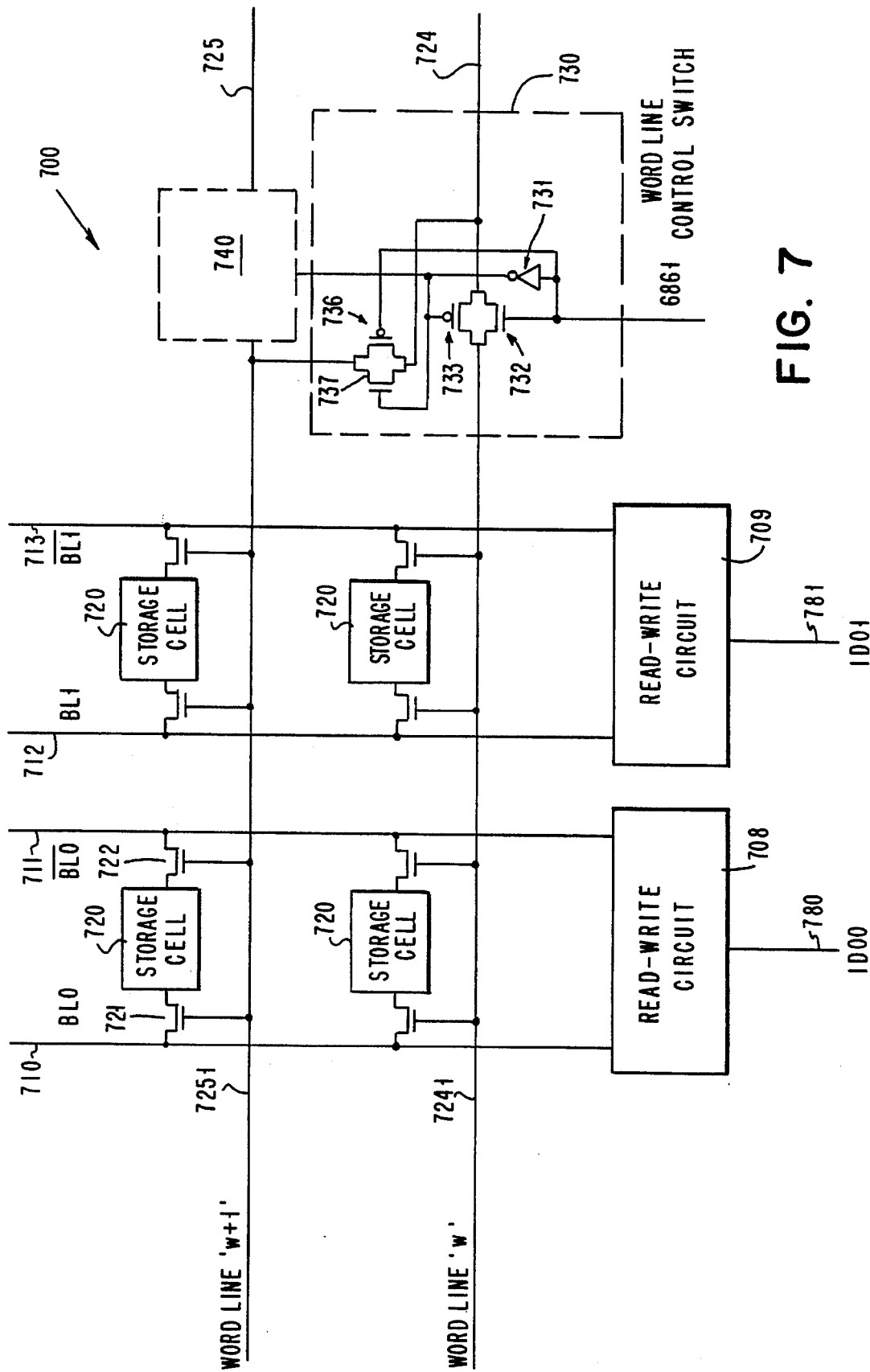
FIG. 7 is block diagram of a preferred embodiment used as an instruction cache memory showing details of the circuitry.

FIG. 7 shows a section of a memory word and the details of the circuitry allowing access to a full cache line independently of the base address by accessing two adjacent memory word lines concurrently. (The base address is the starting address of the first word of the full word line accessed during a given cycle.)

FIG. 7 shows a particular implementation of the word line control switch. Other implementations using logic gates are possible.

The storage cells 720 are like those used in conventional memory devices. The bit lines 710, 711, 712 and 713 are used to transfer the content of the storage cells to the read-write circuits 708 and 709 as in conventional memory devices. The word lines 724 and 725 are driven by a conventional address decoder (such as the box 640 in FIG. 6). The control line 6861 generated in a box such as 660 in FIG. 6, controls the operation of the switch 730.

The word line control switch 730 (block 740 works likewise) can disconnect a word line such as 724 in two sections, one to its right and one to its left (such as 724 and 7241). Three components of switch 730 are as follows: NMOS device 732 and PMOS device 733 and inverter 731 constitute a data transmission gate, when the input control line 6861 is at ground potential, the switch is opened and the nodes 724 and 7241 are disconnected. When the control line 6861 is connected to the supply potential, the switch is closed and nodes 724 and 7241 are connected. Two additional components of switch 730 are devices 736 and 737. NMOS device 737 and PMOS device 736 also constitute a transmission gate connected in a complementary way to transmission gate 732 and 733: when control line 6861 is at ground potential, the transmission gate is conducting providing a connection between node 724 and the left section of the next word line 7251. When control line 6861 is at the supply voltage, this transmission gate (736 and 737) is opened and no connection exists between the word line sections 724 and 7251.

The function of the control switch is therefore to provide a connection between the input word line 724 and either its left section 7241 or the left section of its next adjacent line 7251.

FIG. 8 shows flowchart 800 explaining the method used for the instruction cache.

In the instruction cache embodiment 600 there is only one incoming address and the goal is to provide always N consecutive words of information to the read-port, independently from the base address used in the access. As in the discussion of FIG. 5, it is assumed that the instruction cache memory is organized in rows of four words width.

In decision box 801 the incoming address bits are split in two low bits (a column address) and the remaining high bits (the row address) The two low bits are examined. If they are equal to zero, i.e. the incoming base address is at a memory line boundary, the next operation is in block 805. If the low bits are unequal zero, the next operation is in box 810. In this example it is assumed that line L is selected.

In box 805 the memory operates as in a conventional single port memory. The word lines are fully connected across the rows in the memory array and an access to a full memory line is therefore possible. Only one word line is fully enabled. In this case, the rotator circuit 610 in FIG. 6 does not have to rearrange the order of the words from the array as they come from the array in the correct order already.

In step 810 the two low bits (column address) are used to determine the boundary where to activate the control switches in all the word lines of the instruction cache. The word lines (such as line L) are disconnected at the left boundary of the column of words determined by the same two low bits and connected to the the left section of the next adjacent word line (line L+1). A connection across two adjacent sets of word lines is thus provided. Next step is 815.

In box 815 the word line decoder is activated and the one line (L) is enabled up to the disconnection point, the adjacent next word line (L+1) is enabled from this point to the end of the memory line on the left. The next box is 820.

In box 820 two sections of word lines constituting a cache lines are read, partially from line L and partially from line L+1. The sense amplifiers are used to read the content of the memory cells. The next box is 825.

In box 825 the cache line of N words is realigned using a rotator circuit such that the word corresponding to the lowest address requested appears left adjusted at the memory data port 604 and it is followed by the next (N–1) words from the array.

The figures and the discussion above assume that the two access ports operate synchronously and that multiple accesses to the memories, if present, are synchronous, i.e. they are initiated about at the same time and are supposed to complete about at the same time within a fixed clock cycle. However, this invention is not limited to the two ports operating synchronously. In an asynchronous embodiment, an arbitration circuit must be used to regulate access to the memory.

In addition, given this novel disclosure, one skilled in the art would be able to construct many alternative embodiments of this invention. The number of words in a given word line can also be varied. The word lines can be split into two parts that have a physical relationship other than left and right. The position of the information in the word line can be determined from any predetermined input address bits and therefore the invention is not restricted to using the low 'n' bits of the address input. Also, the invention can be built using alternative circuit technologies that may operate with different requirements, e.g., biasing, polarity, etc. Furthermore, given a technology that allows the use of local and global word lines, the access/control switches can be easily replaced with active logic gates and buffers, providing higher circuit speed. All of these variations are within the contemplation of the present invention.

The application of the circuitry disclosed in this invention is not restricted to computer data and instruction cache memories. The same circuit used for the data cache memory can be applied in dual-ported memory devices in digital circuits other than computer memories.

I claim:

1. A dual ported computer memory apparatus having a first and a second set of address lines for receiving a first and second address on a first and second port respectively, a first and a second data multiplexer connected respectively to a first and a second set of data lines, a plurality of word lines each comprising two or more words, the words having a plurality of storage cells, the words being organized in an array, the apparatus further comprising:

a first and second decoder, located at opposite ends of the word lines, the first decoder connected to a first section of each word line and the second decoder connected to a second section of each word line, the decoders each being able to electrically enable one separate section of a word line;

one or more boundaries of access switches, an access switch in a boundary being located between two words at a position in a word line, the access switches in a given boundary being at the same position in each word line so that the boundary of switches define one or more columns of words, the access switches being able to electrically connect or disconnect one or more words from other words in the word line;

a control logic circuit that divides each first and second sets of address lines into a first and second set of column address lines and the first and second set of word address lines, respectively, and uses the first and second set of column address lines to open selected access switches and to connect the first and second sets of data lines through the first and second data multiplexers to a first and second bit line set, respectively, the first and second bit line sets being respectively connected to a first and second column of words to be accessed; and an address multiplexer, using the first and second word address, for determining which word line the first and second decoders each drive respectively, so that the first decoder drives a first section of word lines and the second decoder drives a second section of word lines, the word to be accessed in the first column is accessed by the first data multiplexer, and the word to be accessed in the second column is accessed by the second data multiplexer.

2. A dual ported computer memory apparatus, as in claim 1, where the column address comprises the low n bits of the address and the row address comprises the remaining bits of the address.

3. A method of accessing two pieces of information simultaneously from a dual ported computer memory apparatus comprising the steps of:

examining a first and a second address to determine the location of a first and a second row that contain information to be accessed, the rows each comprising a plurality of words each word having a plurality of storage cells and the words being in an array;

disconnecting the word lines at a first and second boundary, respectively, by opening access switches, the access switches electrically disconnecting each word line into a section that contains information to be accessed and a section that does not contain information to be accessed, a first decoder enabling the section of the first row containing information to be accessed and a second decoder enabling a section of the second row containing information; and connecting a first set of data lines to the desired word in the first enabled row section and a second set of data lines to the desired word in the second enabled row section so that the information in the first row section is accessed by the first set of data lines and the information in the second row section is accessed by the second set of data lines in one cycle.

* * * * *